(12) United States Patent
Chen et al.

(10) Patent No.: US 11,956,920 B2
(45) Date of Patent: Apr. 9, 2024

(54) LIQUID-COOLED PLATE RADIATOR

(71) Applicant: SHENZHEN MICROBT ELECTRONICS TECHNOLOGY CO., LTD., Shenzhen (CN)

(72) Inventors: Qian Chen, Shenzhen (CN); Fangyu Liu, Shenzhen (CN); Yang Gao, Shenzhen (CN); Yuefeng Wu, Shenzhen (CN); Hongyan Ning, Shenzhen (CN)

(73) Assignee: SHENZHEN MICROBT ELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/802,048

(22) PCT Filed: Dec. 31, 2021

(86) PCT No.: PCT/CN2021/143477
§ 371 (c)(1),
(2) Date: Aug. 24, 2022

(87) PCT Pub. No.: WO2023/015835
PCT Pub. Date: Feb. 16, 2023

(65) Prior Publication Data
US 2023/0119484 A1    Apr. 20, 2023

(30) Foreign Application Priority Data

Aug. 11, 2021   (CN) .......................... 202110917234.2

(51) Int. Cl.
*H05K 7/20*   (2006.01)
(52) U.S. Cl.
CPC ..... *H05K 7/20263* (2013.01); *H05K 7/20254* (2013.01); *H05K 7/20272* (2013.01)

(58) Field of Classification Search
CPC .......... H05K 7/20272; H05K 7/20263; H05K 7/20327; H05K 7/20; H05K 7/20927; H05K 7/2076
See application file for complete search history.

(56) References Cited

U.S. PATENT DOCUMENTS

| | | | |
|---|---|---|---|
| 2002/0011327 A1* | 1/2002 | Fukazu | .............. H05K 7/20927 257/E23.098 |
| 2005/0145366 A1 | 7/2005 | Erel | |

(Continued)

FOREIGN PATENT DOCUMENTS

| | | |
|---|---|---|
| CN | 106449570 A | 2/2017 |
| CN | 207559753 U | 6/2018 |

(Continued)

OTHER PUBLICATIONS

Notification to Grant Patent Right for Invention issued in Chinese Patent Application CN202110917234.2 dated Nov. 16, 2021.

(Continued)

*Primary Examiner* — Adam B Dravininkas
(74) *Attorney, Agent, or Firm* — Harness, Dickey & Pierce, P.L.C.

(57) ABSTRACT

A liquid-cooled plate radiator is disclosed. The liquid-cooled plate radiator includes a radiator body. A coolant liquid runner for circulating a coolant liquid is formed inside the radiator body. The coolant liquid runner includes a plurality of radiating sub-runners. Then, a plurality of fin units are arranged on the radiating sub-runners along a flow direction of the coolant liquid. The fin unit has a plurality of fins extending side by side along the flow direction of the coolant liquid. Moreover, the fins of the front and rear adjacent fin units on the radiating sub-runners are staggered, thereby increasing the radiating area, enhancing the disturbance of the coolant liquid when flowing inside the radiating sub-runners, and improving the radiating efficiency. Thus, the (Continued)

technical problems of limited radiating area and radiating efficiency caused by a single linear coolant liquid runner are solved. The contact area between the liquid-cooled plate radiator and the coolant liquid is effectively improved, and the radiating efficiency is improved by increasing the disturbance of the coolant liquid. The structure is simple.

8 Claims, 9 Drawing Sheets

(56) References Cited

U.S. PATENT DOCUMENTS

| | | | |
|---|---|---|---|
| 2006/0117326 A1* | 6/2006 | Yamauchi | G11B 33/08 |
| | | | 720/600 |
| 2007/0070600 A1* | 3/2007 | Tomioka | F28D 15/0266 |
| | | | 361/688 |
| 2007/0119572 A1 | 5/2007 | Weber et al. | |
| 2007/0125524 A1 | 6/2007 | Zoodsma | |
| 2013/0206371 A1* | 8/2013 | Fujita | F28F 3/12 |
| | | | 165/104.28 |
| 2014/0043765 A1* | 2/2014 | Gohara | H05K 7/20254 |
| | | | 361/699 |
| 2015/0260464 A1* | 9/2015 | Cole | F28F 9/26 |
| | | | 165/185 |

FOREIGN PATENT DOCUMENTS

| | | |
|---|---|---|
| CN | 208955148 U | 6/2019 |
| CN | 109982543 A | 7/2019 |
| CN | 209088029 U | 7/2019 |
| CN | 110080827 A | 8/2019 |
| CN | 209666827 U | 11/2019 |
| CN | 209882439 U | 12/2019 |
| CN | 210406013 U | 4/2020 |
| CN | 210444699 U | 5/2020 |
| CN | 211125625 U | 7/2020 |
| CN | 112040742 A | 12/2020 |
| CN | 212659535 U | 3/2021 |
| CN | 113365485 A | 9/2021 |
| JP | 6563161 B1 | 8/2019 |

OTHER PUBLICATIONS

The Second Office Action issued in Chinese Patent Application CN202110917234.2 dated Oct. 21, 2021.

The First Office Action issued in Chinese Patent Application CN202110917234.2 dated Sep. 24, 2021.

International Search Report regarding Application No. PCT/CN2021/142477, dated May 7, 2022.

* cited by examiner

LIQUID-COOLED PLATE RADIATOR

CROSS-REFERENCE TO RELATED APPLICATIONS

This application is a 371 U.S. National Phase of International Application No. PCT/CN2021/143477, filed on Dec. 31, 2021, which claims priority to Chinese Patent Application No. 202110917234.2, filed on Aug. 11, 2021, entitled "Liquid-Cooled Plate Radiator", the entire disclosures of the above applications are hereby incorporated by reference.

TECHNICAL FIELD

The present application relates to the technical field of liquid-cooled radiating, and in particular to a liquid-cooled plate radiator.

BACKGROUND ART

More and more electronic devices adopt liquid-cooled radiating at present.

In some technologies, a common way of liquid-cooled radiating is to use a liquid-cooled plate for radiating. For example, a hash board with heating elements such as chips is attached to one or both surfaces of the liquid-cooled plate. Then a coolant liquid flows into the liquid-cooled plate from an inlet, flows through a coolant liquid runner, and then flows out from an outlet. In this way, the circulation flow achieves liquid-cooled radiating of the hash board.

However, in the above solution, the coolant liquid runner of the liquid-cooled plate is generally linear. The runner is single, the radiating area is limited, and the efficiency of liquid-cooled radiating is low accordingly.

SUMMARY OF THE INVENTION

In view of at least one aspect of the above technical problem, embodiments of the present application provide a liquid-cooled plate radiator. The liquid-cooled plate radiator includes a radiator body. A coolant liquid runner for circulation flow of a coolant liquid is formed inside the radiator body. The coolant liquid runner includes a plurality of radiating sub-runners. Then, a plurality of fin units are arranged on the radiating sub-runners along a flow direction of the coolant liquid. The fin unit has a plurality of fins extending side by side along the flow direction of the coolant liquid. Moreover, the fins of the front and rear adjacent fin units on the radiating sub-runners are staggered, thereby increasing the radiating area, enhancing the disturbance of the coolant liquid when flowing inside the radiating sub-runners, and improving the radiating efficiency.

That is to say, in view of the above-mentioned technical problems of limited radiating area and low radiating efficiency when a coolant liquid flows through a single linear radiating sub-runner, in the embodiments of the present application, a plurality of fin units are arranged on the radiating sub-runner in a front-rear staggered manner along a flow direction of the coolant liquid. In this way, on the one hand, the fins of the fin units increase the contact area between the liquid-cooled plate radiator and the coolant liquid, thereby increasing the radiating area. On the other hand, the fins of the front and rear adjacent fin units are staggered, which results in a large disturbance formed between two adjacent fin units when the coolant liquid flows from the front fin unit to the rear fin unit. As will be readily appreciated, this disturbance enhances the convective heat transfer intensity of the coolant liquid, thereby enhancing the heat transfer effect between the coolant liquid and the fin units. Thus, the technical problems of limited radiating area and low radiating efficiency caused by a single linear coolant liquid runner are solved. The contact area between the liquid-cooled plate radiator and the coolant liquid is effectively improved, and the radiating efficiency is improved by increasing the disturbance of the coolant liquid. The structure of the fins is simple.

Embodiments of the present application provide a liquid-cooled plate radiator. The liquid-cooled plate radiator includes:
a radiator body;
a coolant liquid runner formed inside the radiator body, the coolant liquid runner being for circulating a coolant liquid, the coolant liquid runner comprising a plurality of radiating sub-runners; and
a plurality of fin units, the fin units being arranged on the radiating sub-runners along a flow direction of the coolant liquid, a fin unit of the fin units comprising a plurality of fins extending side by side along the flow direction of the coolant liquid,
wherein the fins of the adjacent fin units are staggered along the flow direction of the coolant liquid.

In an embodiment, the radiator body has a first bearing surface and a second bearing surface opposite to each other, at least one of the first bearing surface and the second bearing surface is used for bearing a liquid-cooled electronic device, and the liquid-cooled electronic device comprises a plurality of heating elements arranged in an array, wherein
a predetermined gap is formed between the adjacent fin units along the flow direction of the coolant liquid, and the predetermined gap corresponds to a surface of the radiator body and avoids the heating elements;
the adjacent fins in each of the fin units are arranged side by side at a predetermined interval, and the adjacent fin units are staggered at half of the predetermined interval.

In an embodiment, the liquid-cooled plate radiator further includes:
split-flow and diversion units, being arranged in the coolant liquid runner,
wherein a split-flow and diversion unit of the split-flow and diversion units is arranged at an end of a radiating sub-runner of the radiating sub-runners corresponding to the inflow of the coolant liquid, and the split-flow and diversion unit is configured to divert the coolant liquid into the radiating sub-runner.

In an embodiment, a split-flow tip is formed at an end of the split-flow and diversion unit facing the coolant liquid relative to the flow direction of the coolant liquid, and the split-flow and diversion unit is bifurcated and extended from the split-flow tip along the flow direction of the coolant liquid with a first split-flow and diversion surface and a second split-flow and diversion surface.

In an embodiment, a diversion tip is formed at an end of the split-flow and diversion unit facing away from the coolant liquid, relative to the flow direction of the coolant liquid, and the diversion tip is formed by converging a third split-flow and diversion surface and the first split-flow and diversion surface, wherein the third split-flow and diversion surface extends along an axial direction of the radiating sub-runner from an end of the second split-flow and diversion surface.

In an embodiment, along a radial direction of the coolant liquid runner,
the coolant liquid runner is divided into two branches with a first width and a second width at the split-flow tip, and the coolant liquid runner is divided into two branches with a third width and a fourth width at the diversion tip, wherein a ratio of the first width to the second width is equal to a ratio of the third width to the fourth width.

In an embodiment, the split-flow tip protrudes out of a region enclosed by an extension line of a side wall of the radiating sub-runner at a corner of an end of the radiating sub-runner.

In an embodiment, the radiating sub-runner extends along a first direction, the plurality of radiating sub-runners are arranged side by side and connected in series to form the coolant liquid runner, ends of the adjacent radiating sub-runners are connected through a connecting sub-runner along a second direction, and the second direction is perpendicular to the first direction;

the split-flow and diversion unit comprises a split-flow and diversion column with a right triangle cross section, wherein the first split-flow and diversion surface corresponds to a hypotenuse of the right triangle, and the second split-flow and diversion surface and the third split-flow and diversion surface respectively correspond to two right angle sides of the right triangle.

In an embodiment, the radiator body comprises a first substrate and a second substrate being opposite to each other, the first substrate is provided with a first groove, and the second substrate is provided with a second groove, wherein the first groove and the second groove are in mirror symmetry, a first split-flow and diversion column is arranged in the first groove, a second split-flow and diversion column is arranged in the second groove, and the first split-flow and diversion column and the second split-flow and diversion column are in mirror symmetry;

when the first substrate and the second substrate are fastened oppositely, the first groove and the second groove form the coolant liquid flow runner, and while, the first split-flow and diversion column and the second split-flow and diversion column form a split-flow and diversion unit.

In an embodiment, two ends of the coolant liquid flow runner respectively form a liquid inlet and a liquid outlet on an end face of the radiator body, the liquid inlet is provided with a liquid inlet connector, and the liquid outlet is provided with a liquid outlet connector;

a height of the first split-flow and diversion column is lower than a depth of the first groove along a depth direction of the first groove;

a height of the second split-flow and diversion column is lower than a depth of the second groove along a depth direction of the second groove.

BRIEF DESCRIPTION OF THE DRAWINGS

In order to more clearly illustrate the technical solutions of embodiments of the present invention, the drawings needing to be used in the description of the embodiments of the present application will be briefly introduced below. It is apparent that the drawings in the following description are merely some embodiments of the present application and a person ordinarily skilled in the art may also obtain other drawings according to these drawings without involving any inventive effort.

REFERENCE NUMERALS

10—radiator body, 11—first substrate, 12—second substrate, 13—liquid inlet, 14—liquid outlet, 15—liquid inlet connector, 16—liquid outlet connector, 17—riveting stud;

111—first groove, 112—first split-flow and diversion column;

121—second groove, 122—second split-flow and diversion column;

20—coolant liquid runner, 21—radiating sub-runner, 22—communicating sub-runner;

211—side wall;

30—split-flow and diversion unit, 31—split-flow tip, 32—diversion tip, 33—first split-flow and diversion surface, 34—second split-flow and diversion surface, 35—third split-flow and diversion surface;

40—fin unit, 41—fin, 42—predetermined interval, 43—predetermined gap;

50—liquid-cooled electronic device, 51—heating element;

X—first direction, Y—second direction, Z—third direction;

a—width of connecting sub-runner, b—first width, c—third width, d—width of radiating sub-runner, e—length of second split-flow and diversion surface along a flow direction of a coolant liquid;

M1—first branch, M2—second branch, M3—third branch, M4—fourth branch.

DETAILED DESCRIPTION OF EMBODIMENTS

In order to better understand the above technical solution, exemplary embodiments of the present application will now be described in detail with reference to the accompanying drawings. It is apparent that the described embodiments are merely a few, but not all embodiments of the present application. It will be appreciated that the present application is not limited to the exemplary embodiments described herein.

First, with reference to FIG. 1 and FIGS. 6-9, an embodiment of the present application discloses a liquid-cooled plate radiator. The liquid-cooled plate radiator includes a radiator body 10, a coolant liquid runner 20, and fin units 40. The coolant liquid runner 20 is formed inside the radiator body 10, and used for circulation flow of a coolant liquid. The coolant liquid runner 20 includes a plurality of radiating sub-runners 21. The fin units 40 are arranged on the radiating sub-runners 21 along a flow direction of the coolant liquid. A fin unit 40 includes a plurality of fins 41 extending side by side along the flow direction of the coolant liquid. The fins 41 of the adjacent fin units 40 are staggered along the flow direction of the coolant liquid.

Overall speaking, as will be readily appreciated, the liquid-cooled plate radiator performs liquid-cooled radiating on a liquid-cooled electronic device as follows. The liquid-cooled electronic device needs to be attached to the liquid-cooled plate radiator. Then, a coolant liquid with a relatively low temperature flows into the liquid-cooled plate radiator from the liquid inlet, and exchanges heat with the liquid-cooled electronic device while flowing through the coolant liquid runner. That is, liquid-cooling radiating is performed on the liquid-cooled electronic device. After absorbing heat, the coolant liquid with a relatively high temperature flows out of the liquid-cooled plate radiator from the liquid outlet and releases heat outside. In this way, the circulation flow achieves liquid-cooled radiating. In addition, the above liquid-cooled electronic device is, for example, a hash board on which a heating element such as a chip is arranged.

In some technologies, the coolant liquid runner is generally linear. The runner is single, the radiating area is limited, and the efficiency of liquid-cooled radiating is low accordingly.

In view of the above situation, in an embodiment of the present application, a coolant liquid runner for circulation of a coolant liquid is provided inside the liquid-cooled plate radiator. The coolant liquid runner includes a plurality of radiating sub-runners. As will be readily appreciated, the coolant liquid flowing through the radiating sub-runners plays a major role in cooling the chip on the hash board. Then, a plurality of fin units are provided on the radiating sub-runner along the flow direction of the coolant liquid. A fin unit has a plurality of fins extending side by side along the flow direction of the coolant liquid. For example, referring to FIGS. 6 and 8, the fins extend along a first direction X. In this way, the coolant liquid flows through the fins to increase the contact area between the liquid-cooled plate radiator and the coolant liquid, thereby increasing the radiating area. In addition, with reference to FIGS. 6 and 7, the front and rear adjacent fin units are staggered along the flow direction of the coolant liquid. That is, referring specifically to FIG. 7, in the field of view being along the flow direction of the coolant liquid, a fin of the rear fin unit corresponds to a certain position between two fins of the front fin unit. As will be readily appreciated, in this way, when the coolant liquid flows, the front-rear staggered fin units can increase the disturbance of the coolant liquid in the radiating sub-runner, thereby improving the intensity of convective heat transfer, enhancing the heat transfer effect between the coolant liquid and the fins, and improving the efficiency of liquid-cooled radiating.

As will be readily appreciated, the above fin unit may adopt snap-fit type fins or folding type fins.

An embodiment of the present application provides a liquid-cooled plate radiator. The liquid-cooled plate radiator includes a radiator body. A coolant liquid runner is formed inside the radiator body, and the coolant liquid runner is used for circulating a coolant liquid. The coolant liquid runner includes a plurality of radiating sub-runners. Then, a plurality of fin units are arranged on the radiating sub-runners along a flow direction of the coolant liquid. The fin unit has a plurality of fins extending side by side along the flow direction of the coolant liquid. Moreover, the fins of the front and rear adjacent fin units on the radiating sub-runners are staggered, thereby increasing the radiating area, enhancing the disturbance of the coolant liquid when flowing inside the radiating sub-runners, and improving the radiating efficiency.

That is to say, in view of the above-mentioned technical problems of limited radiating area and low radiating efficiency when a coolant liquid flows through a single linear radiating sub-runner, in the embodiments of the present application, a plurality of fin units are arranged on the radiating sub-runner in a front-rear staggered manner along a flow direction of the coolant liquid. In this way, on the one hand, the fins of the fin units increase the contact area between the liquid-cooled plate radiator and the coolant liquid, thereby increasing the radiating area. On the other hand, the fins of the front and rear adjacent fin units are staggered, resulting in a large disturbance formed between two adjacent fin units when the coolant liquid flows from the front fin unit to the rear fin unit. As will be readily appreciated, this disturbance enhances the convective heat transfer intensity of the coolant liquid, thereby enhancing the heat transfer effect between the coolant liquid and the fin units. Thus, the technical problems of limited radiating area and low radiating efficiency caused by a single linear coolant liquid runner are solved. The contact area between the liquid-cooled plate radiator and the coolant liquid is effectively increased, and the radiating efficiency is improved by increasing the disturbance of the coolant liquid. The structure of the fins is simple.

In a specific implementation, the radiator body 10 has a first bearing surface and a second bearing surface opposite to each other. The first bearing surface and/or the second bearing surface are used for bearing a liquid-cooled electronic device 50. The liquid-cooled electronic device 50 includes a plurality of heating elements 51 arranged in an array. A predetermined gap 43 is formed between adjacent fin units 40 along the flow direction of the coolant liquid. The predetermined gap 43 corresponding to a surface of the radiator body 10 avoids the heating elements 51. The adjacent fins 41 in a fin unit 40 are arranged side by side at a predetermined interval 42. The adjacent fin units 40 are staggered at half of the predetermined interval 42.

Figure 9:
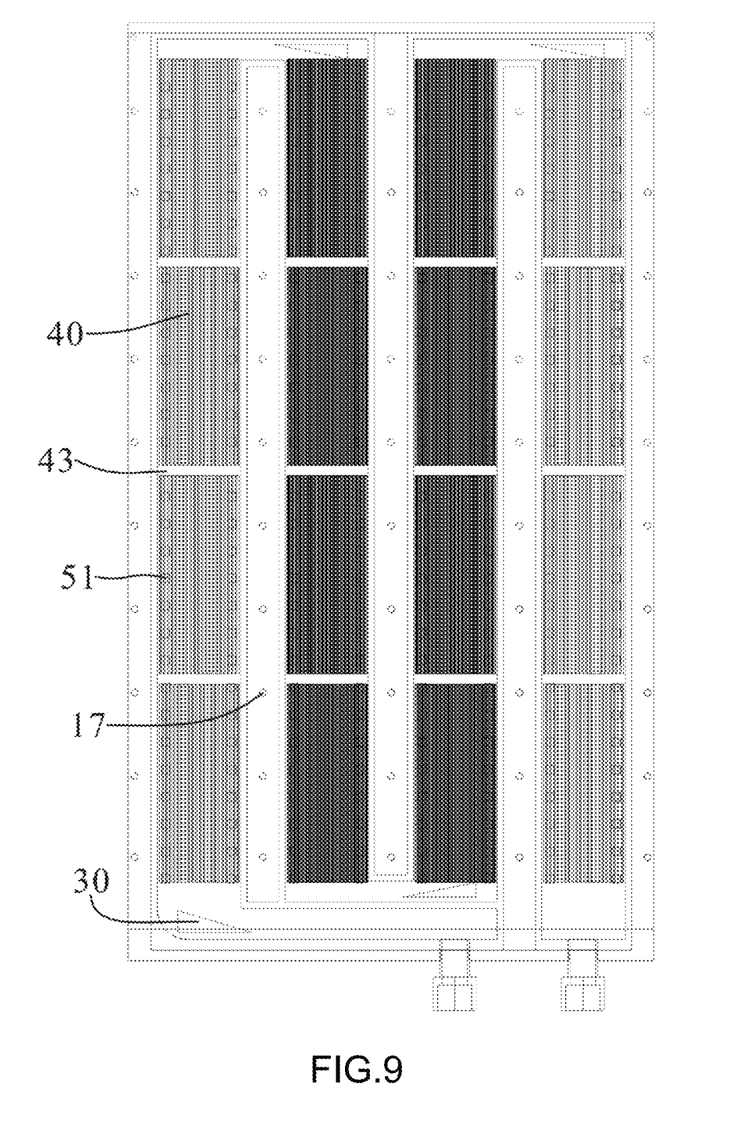
FIG. 9 is a perspective structure diagram of a heating element avoided by the predetermined gap according to an embodiment of the present application.

Specifically, referring to FIG. 9, in order to ensure that the front-rear staggered fin units disturb the coolant liquid, a predetermined gap 43 may be provided between adjacent fin units on the radiating sub-runner. Due to the disturbance of the coolant liquid at the predetermined gap 43, different cooling effects are produced on surface positions of the radiator body corresponding to the predetermined gap and the fins, respectively. Thus, in order to ensure uniformity of the liquid-cooled radiating for the liquid-cooled electronic device, the predetermined gap 43 should avoid the heating element 51 on the liquid-cooled electronic device. For example, a surface region of the liquid-cooled plate radiator corresponding to the predetermined gap should not be provided with a chip, etc.

Figure 7:
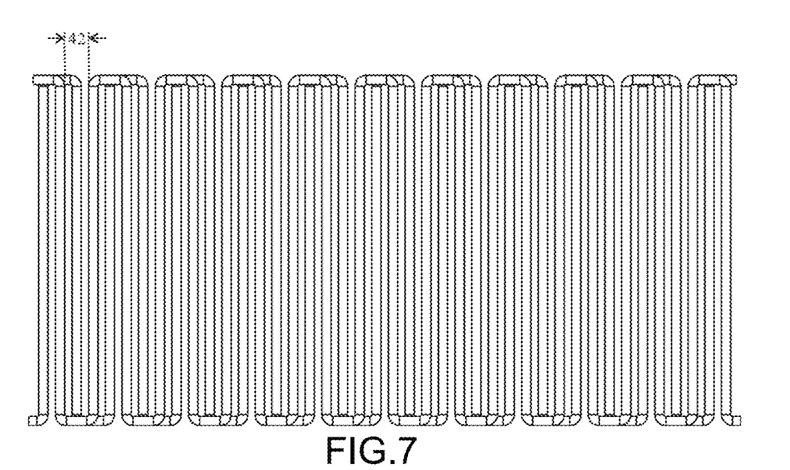
FIG. 7 is a structure diagram in which adjacent fin units are staggered at half of a predetermined interval according to an embodiment of the present application, where a flow direction of a coolant liquid is perpendicular to a principal plane.
Figure 8:
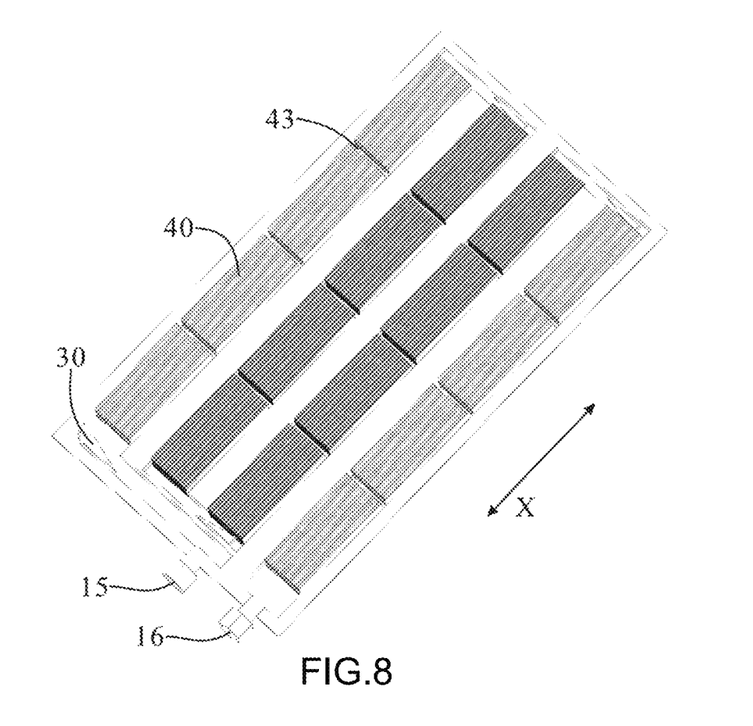
FIG. 8 is a structure diagram of a radiating sub-runner provided with the fin units according to an embodiment of the present application.

In addition, for the above-mentioned staggered arrangement of the fins of the adjacent fin units, details are described with reference to FIG. 7. For example, when the fins on a fin unit are arranged side by side at a predetermined interval 42, adjacent fin units may be staggered at half of the predetermined interval 42. For example, in the field of view being along the flow direction of the coolant liquid, a fin of the rear fin unit corresponds to a middle position between two fins of the front fin unit, thereby achieving a better flow disturbance effect.

The structure in which a plurality of fin units are arranged on the radiating sub-runner in the liquid-cooled plate radiator is described above, and the structure of a liquid inlet end of the radiating sub-runner will be described in detail below.

In one possible implementation, the liquid-cooled plate radiator further includes split-flow and diversion units 30. Split-flow and diversion units 30 are arranged in the coolant liquid runner 20. A split-flow and diversion unit 30 is arranged at an end of a radiating sub-runner 21 corresponding to the inflow of the coolant liquid. The split-flow and diversion unit 30 is configured to divert the coolant liquid into the radiating sub-runner 21.

During the liquid-cooled radiating of the hash board, considering the distribution of the chips on the hash board and in order to absorb heat generated by the chips to the maximum extent, the coolant liquid runner tends to be relatively wide. In this way, the coolant liquid cannot be expanded or spread evenly in a width direction when flowing through the coolant liquid runner, or in other words, the temperature distribution of the coolant liquid is uneven in a cross section perpendicular to the flow direction of the coolant liquid, so that the local chip temperature difference will be large.

In view of the above situation, in an embodiment of the present application, a split-flow and diversion unit is further arranged at an end of the radiating sub-runner corresponding to the inflow of the coolant liquid. With reference to FIGS. 1-5, the split-flow and diversion unit may produce a split-flow effect on the coolant liquid before the coolant liquid flows into the radiating sub-runner, thereby promoting the uniformity of the distribution of the coolant liquid in the width direction of the radiating sub-runner, avoiding the above situation that the local chip temperature difference is large, and improving the radiating uniformity.

Figure 1:
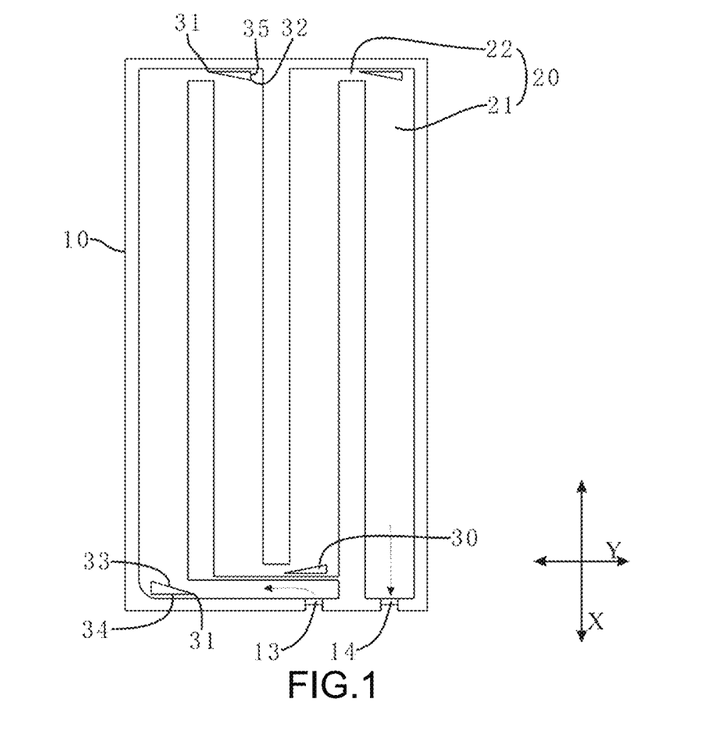
FIG. 1 is a cross-sectional structure diagram of a radiator body according to an embodiment of the present application.
Figure 2:
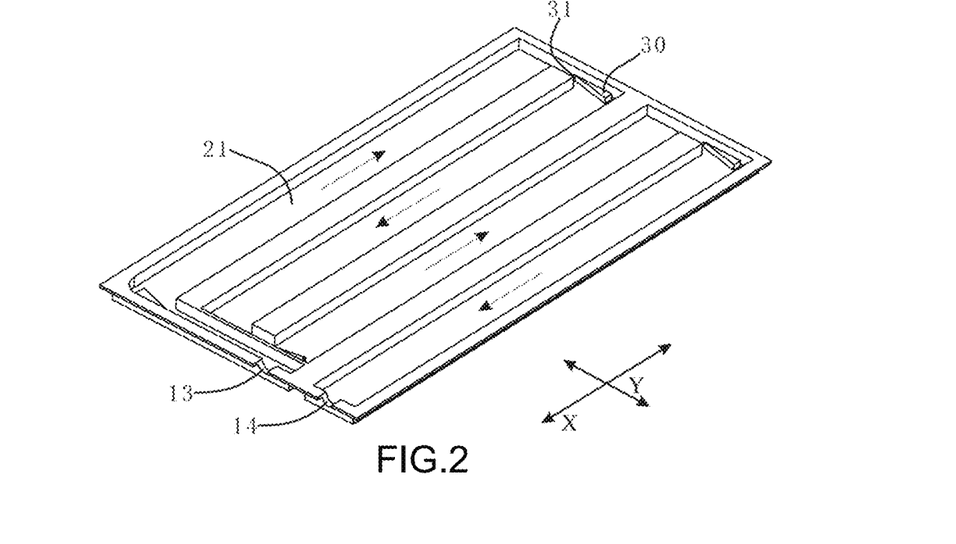
FIG. 2 is a structure diagram of the radiator body shown in FIG. 1 from another angle.

It is to be noted that on the one hand, with reference to FIGS. 1 and 2, a plurality of radiating sub-runners may be arranged, for example, side by side, and then connected in series to form a coolant liquid runner. Since the split-flow and diversion units need to be provided at ends of the radiating sub-runners corresponding to the inflow of the coolant liquid, while a plurality of split-flow and diversion units are distributed at two ends of the radiator body, and are arranged at intervals at each end. Or, on the other hand, as will be appreciated, a plurality of radiating sub-runners are arranged side by side and then connected in parallel to form a coolant liquid runner. Since split-flow and diversion units need to be provided at ends of the radiating sub-runners corresponding to the inflow of the coolant liquid, while a plurality of split-flow and diversion units are distributed at one end of the radiator body. In addition, as will be readily appreciated, in order to achieve a split-flow effect on the coolant liquid, the split-flow and diversion units may take various forms (see FIG. 3, FIG. 4, or FIG. 5) according to the layout of the above plurality of radiating sub-runners. Details will be given below and are omitted herein.

In view of the above-mentioned technical problem that, for example, when the radiating sub-runner is relatively wide, the coolant liquid often cannot be expanded in the width direction of the radiating sub-runner in time during the process of flowing through the radiating sub-runner, in the embodiment of the present application, a split-flow and diversion unit is provided at a coolant liquid inlet end of the radiating sub-runner. The split-flow and diversion unit can play the roles of splitting and diverting the coolant liquid, so as to effectively improve the problem of uneven distribution of the coolant liquid in the width direction of the flow runner, thereby improving the radiating uniformity of the whole hash board. That is, the technical problem of poor radiating uniformity caused by uneven distribution of the coolant liquid in the width direction of the radiating sub-runner during circulating the coolant liquid is solved. The situation of, for example, a large local chip temperature difference on the hash board is effectively avoided, and the technical effect of improving the radiating uniformity of the whole hash board is achieved. Moreover, the structure is simple, and the cost is saved.

Figure 3:
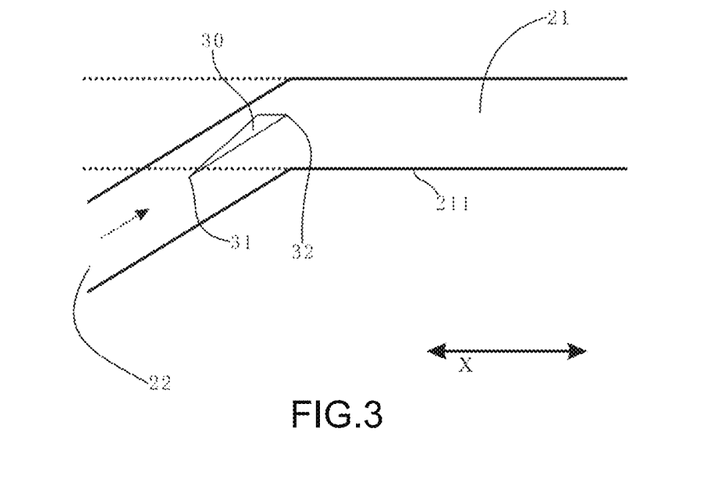
FIG. 3 is another structure diagram of a split-flow and diversion unit according to an embodiment of the present application.

In one possible implementation, with continued reference to FIGS. 1 and 3, a split-flow tip 31 is formed at an end of the split-flow and diversion unit 30 facing the coolant liquid, relative to the flow direction of the coolant liquid. The split-flow and diversion unit 30 is bifurcated and extended from the split-flow tip 31 along the flow direction of the coolant liquid with a first split-flow and diversion surface 33 and a second split-flow and diversion surface 34.

Specifically, a split-flow tip is formed at an end of the split-flow and diversion unit facing the coolant liquid, and a first split-flow and diversion surface and a second split-flow and diversion surface extend angularly from the split-flow tip. In this way, the split-flow effect on the coolant liquid is achieved by means of two split-flow and diversion surfaces which branch off from the split-flow tip.

As will be appreciated, FIGS. 1 and 3 are plane views. A depth direction of the radiating sub-runner (i.e. perpendicular to the plane of FIGS. 1 and 3) is set as a third direction Z. Then, the split-flow tip, the first split-flow and diversion surface and the second split-flow and diversion surface should extend along the third direction so as to form a wedge shape.

In a specific implementation, with continued reference to FIGS. 1 and 3, a diversion tip 32 is formed at an end of the split-flow and diversion unit 30 facing away from the coolant liquid, relative to the flow direction of the coolant liquid. The diversion tip 32 is formed by converging a third split-flow and diversion surface 35 and the first split-flow and diversion surface 33. The third split-flow and diversion surface 35 extends along an axial direction of the radiating sub-runner 21 from an end of the second split-flow and diversion surface 34.

Specifically, a diversion tip is formed at an end of the split-flow and diversion unit facing away from the coolant liquid, and a third split-flow and diversion surface and the first split-flow and diversion surface extend angularly from the diversion tip. That is, a cross section of the split-flow and diversion unit perpendicular to the third direction is, for example, a triangle. A long side of the triangle corresponds to the first split-flow and diversion surface, and then two short sides of the triangle respectively correspond to the second split-flow and diversion surface and the third split-flow and diversion surface.

In this way, when two ends of the split-flow and diversion unit are configured as wedge-shaped tips and the third split-flow and diversion surface extends along the axial direction of the radiating sub-runner, on the one hand, the wedge-shaped split-flow tip and diversion tip respectively facilitate the split-flow and diversion of the coolant liquid, and on the other hand, the third split-flow and diversion surface extends along the axial direction of the radiating sub-runner to ensure that no vacuum region of the coolant liquid is formed at the liquid inlet end of the radiating sub-runner, thereby effectively improving the uniformity of the coolant liquid in the width of the radiating sub-runner.

As will be readily appreciated, an angle between the first split-flow and diversion surface and the second split-flow and diversion surface, and an angle between the first split-flow and diversion surface and the third split-flow and diversion surface are subject to various specifications and sizes, e.g. the length size of the split-flow and diversion unit, the width of the radiating sub-runner, and the size at the corner of the coolant liquid runner, etc.

As will be readily appreciated, the above embodiments respectively describe the split-flow tip and the diversion tip of the split-flow and diversion unit, and as to the form between the split-flow tip and the diversion tip, it should be determined according to actual needs (e.g. the angle of the corner, etc.). For example, referring to FIG. 1, when the corner is a right angle, the second split-flow and diversion surface and the third split-flow and diversion surface of the split-flow and diversion unit are perpendicular, or referring to FIG. 3, when the corner is an obtuse angle, an included angle between the second split-flow and diversion surface and the third split-flow and diversion surface of the split-flow and diversion unit is an obtuse angle.

Figure 5:
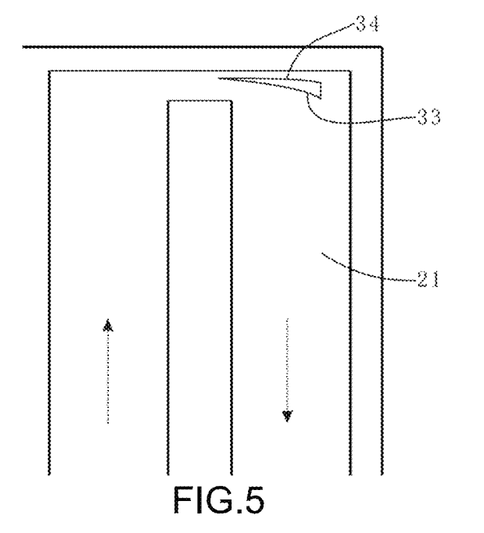
FIG. 5 is yet another structure diagram of the split-flow and diversion unit according to an embodiment of the present application.
Figure 6:
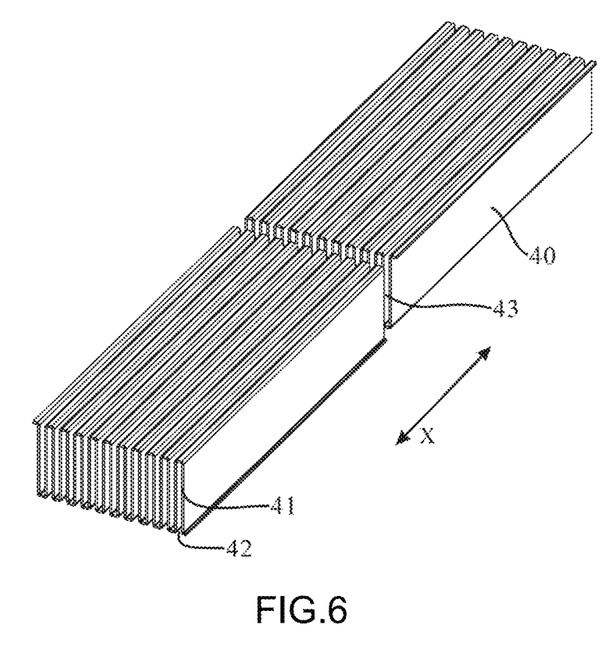
FIG. 6 is an arrangement structure diagram of adjacent fin units according to an embodiment of the present application.

In addition, at least the first split-flow and diversion surface 33 and the second split-flow and diversion surface 34 may be arc-shaped diversion surfaces according to actual needs. Referring to FIG. 5, for example, two arc-shaped split-flow and diversion surfaces forming a split-flow tip can likewise achieve a split-flow effect.

Generally, the end of the radiating sub-runner corresponding to the inflow of the coolant liquid is a corner of the coolant liquid runner, and the split-flow and diversion unit is provided at the corner. Moreover, the split-flow tip of the split-flow and diversion unit should face the coolant liquid, and then the diversion tip of the split-flow and diversion unit should be located near the end face of the radiating sub-runner, so that a better split-flow effect can be produced. That is, the diversion tip 32 of the split-flow and diversion unit cannot protrude too far into the radiating sub-runner 21 and cannot be too far from the end face of the radiating sub-runner 21. As will be readily appreciated, since the surface of the radiator body corresponding to the diversion tip is generally not provided with a heating element, when the diversion tip 32 protrudes too far into the radiating sub-runner 21, the radiating area of the radiating sub-runner 21 corresponding to the surface of the radiator body will be reduced, thereby reducing the area on the radiator body where the heating element can be mounted. When the diversion tip 32 is too far away from the end face of the radiating sub-runner 21, it is not possible to produce a split-flow effect on the coolant liquid that is about to flow into the radiating sub-runner.

In a specific implementation, along a radial direction of the coolant liquid runner, the coolant liquid runner 20 is divided into two branches with a first width and a second width corresponding to the split-flow tip 31, and the coolant liquid runner 20 is divided into two branches with a third width and a fourth width corresponding to the diversion tip 32. A ratio of the first width to the second width is equal to a ratio of the third width to the fourth width.

With specific reference to FIGS. 3-5 and FIGS. 15 and 16, as will be readily appreciated, the wedge-shaped split-flow tip divides the coolant liquid runner at the position thereof into an outer first branch M1 and an inner second branch M2 at the corner of the coolant liquid runner. The widths of the first branch M1 and the second branch M2 are a first width and a second width respectively. Similarly, the wedge-shaped diversion tip divides the coolant liquid runner at the position thereof into an outer third branch M3 and an inner fourth branch M4. The widths of the third branch M3 and the fourth branch M4 are a third width and a fourth width respectively. A width ratio of the first branch M1 to the second branch M2 is equal to a width ratio of the third branch M3 to the fourth branch M4, i.e. a ratio of the first width to the second width is equal to a ratio of the third width to the fourth width. That is to say, the split-flow tip and the diversion tip divide the coolant liquid runner in the same proportion along the radial direction of the coolant liquid runner (radially inward at the same time or radially outward at the same time), thereby ensuring even distribution of the coolant liquid.

Figure 4:
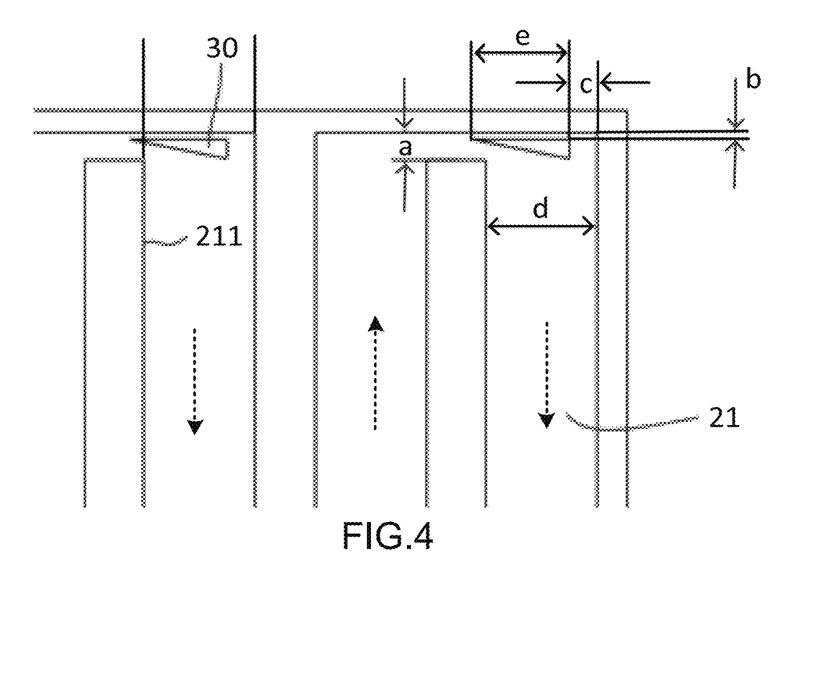
FIG. 4 is a partially enlarged view of FIG. 1.
Figure 15:
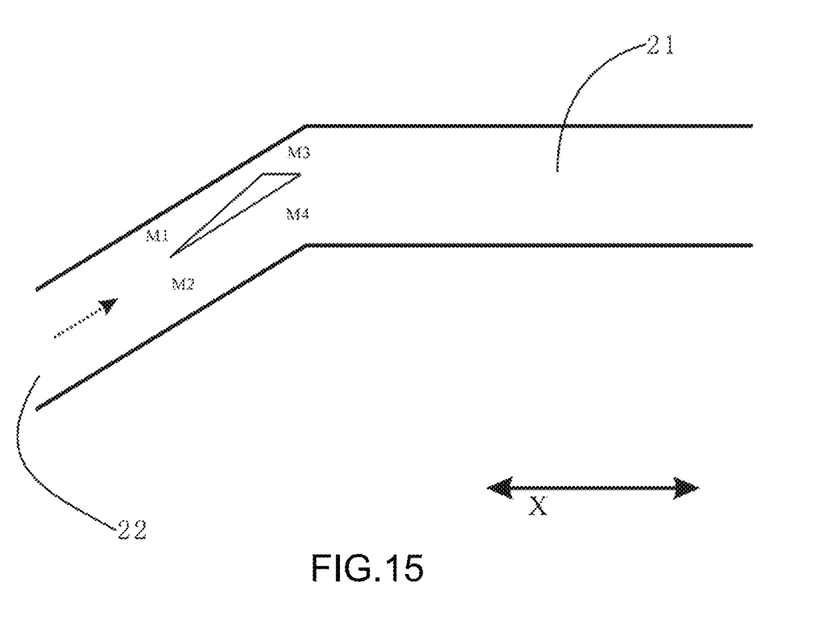
FIG. 15 is a case where a coolant liquid runner is divided into two branches corresponding to a split-flow tip and a diversion tip in FIG. 3 respectively.
Figure 16:
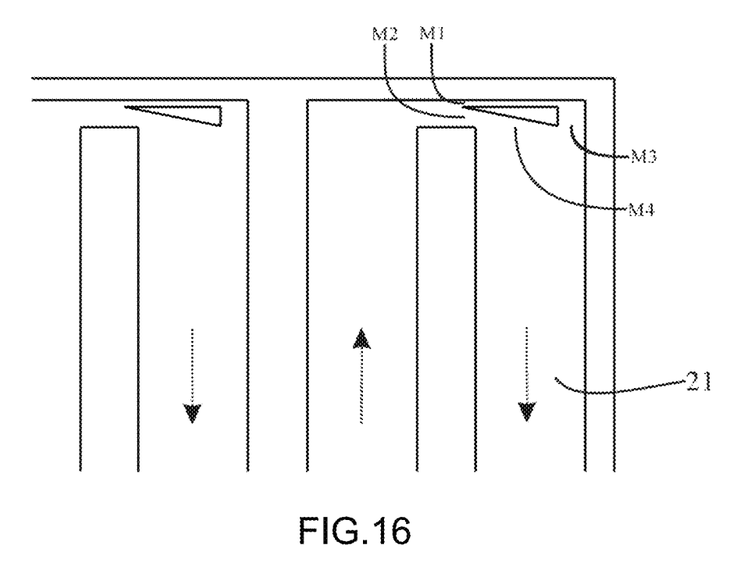
FIG. 16 is a case where a coolant liquid runner is divided into two branches corresponding to a split-flow tip and a diversion tip in FIG. 4 respectively.

For example, with reference to FIGS. 4 and 15, the split-flow tip divides the coolant liquid runner at the position thereof into an outer first branch M1 and an inner second branch M2. A width ratio of the first branch M1 to the second branch M2 is 1/3, i.e. b/(a−b)=1/3. Then, the diversion tip likewise divides the coolant liquid runner (i.e. radiating sub-runner) at the position thereof into an outer third branch M3 and an inner fourth branch M4. A width ratio of the third branch M3 to the fourth branch M4 is also 1/3, i.e. c/(d−c)=1/3.

In a specific implementation, the split-flow tip 31 protrudes out of a region enclosed by an extension line of a side wall 211 of the radiating sub-runner 21, at a corner of an end of the radiating sub-runner 21.

With specific reference to FIG. 3 or FIG. 4, the dotted lines in FIGS. 3 and 4 are extension lines of side walls of the radiating sub-runner. As will be readily appreciated, the split-flow tip of the split-flow and diversion unit protrudes out of a region enclosed by an extension line of a side wall of the radiating sub-runner at a corner of an end of the radiating sub-runner. In other words, with respect to the region enclosed by the radiating sub-runner and the extension lines thereof, the split-flow tip of the split-flow and diversion unit should protrude out of this region and not be covered by this region, so as to ensure that the coolant liquid is diverted before flowing into the next radiating sub-runner.

For example, referring to FIG. 4, e+c>d.

In a specific implementation, the radiating sub-runner 21 extends along a first direction X. The plurality of radiating sub-runners 21 are arranged side by side and connected in series to form the coolant liquid runner 20. Ends of the adjacent radiating sub-runners 21 are connected through a connecting sub-runner 22 along a second direction Y. The second direction Y is perpendicular to the first direction X. The split-flow and diversion unit 30 includes a split-flow and diversion column with a right triangle cross section. The first split-flow and diversion surface 33 corresponds to a hypotenuse of the right triangle. The second split-flow and diversion surface 34 and the third split-flow and diversion surface 35 respectively correspond to two right angle sides of the right triangle.

In the embodiment of the present application, referring to FIGS. 1 and 4, specifically, a coolant liquid runner is generally configured as: the plurality of radiating sub-runners extend linearly along the first direction, the plurality of radiating sub-runners are arranged side by side, and then the adjacent radiating sub-runners are connected end to end via a connecting sub-runner along the second direction. That is, the corner at the end of the radiating sub-runner is a right-angled structure. In such condition, a cross section of the split-flow and diversion column perpendicular to the third direction is a right triangle. A hypotenuse of the right triangle corresponds to the first split-flow and diversion surface, and two right angle sides of the right triangle respectively correspond to the second split-flow and diversion surface and the third split-flow and diversion surface. In addition, two ends of the hypotenuse of the right triangle respectively correspond to the split-flow tip and the diversion tip. The split-flow tip should protrude beyond a region enclosed by the radiating sub-runner and extension lines thereof. The diversion tip should be located near the end of the radiating sub-runner. One side of the right triangle extends along the axial direction of the radiating sub-runner, i.e. along the first direction, and the other side of the right triangle extends along the second direction. In this way, the split-flow and diversion column not only splits and diverts the coolant liquid, but also ensures that there is no retention of the coolant liquid at a right-angle corner.

As will be readily appreciated, the directions of the dotted arrows in FIGS. 1 to 5 indicate the flow directions of the coolant liquid.

In one possible implementation, the radiator body 10 includes a first substrate 11 and a second substrate 12 opposite to each other. The first substrate 11 is provided with a first groove 111, and the second substrate 12 is provided with a second groove 121. The first groove 111 and the second groove 121 are in mirror symmetry. A first split-flow and diversion column 112 is arranged in the first groove 111. A second split-flow and diversion column 122 is arranged in the second groove 121. The first split-flow and diversion column 112 and the second split-flow and diversion column 122 are in mirror symmetry. When the first substrate 11 and the second substrate 12 are fastened oppositely, the first groove 111 and the second groove 121 form the coolant liquid runner 20. Meanwhile, the first split-flow and diversion column 112 and the second split-flow and diversion column 122 form a split-flow and diversion unit 30.

Figure 10:
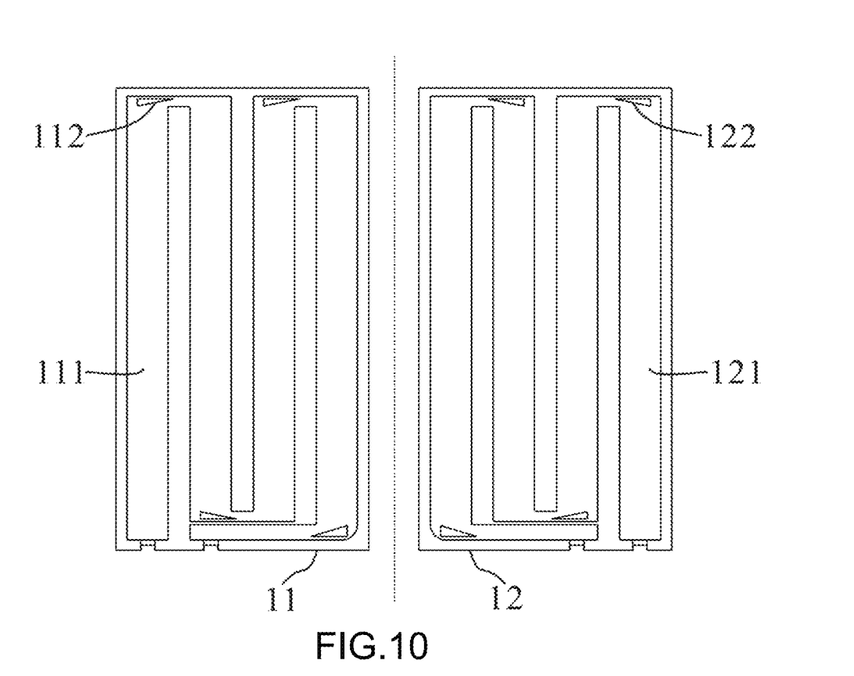
FIG. 10 is a structure diagram of mirror symmetry of a first substrate and a second substrate according to an embodiment of the present application.
Figure 11:
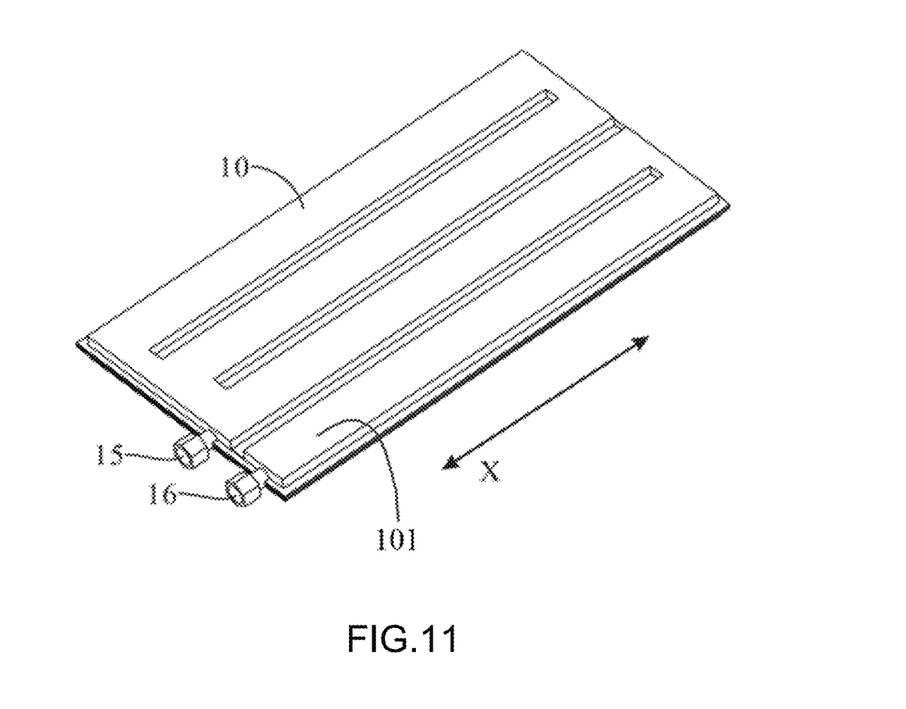
FIG. 11 is a structure diagram of the first substrate and the second substrate after being fastened oppositely according to an embodiment of the present application.

In the embodiment of the present application, with reference to FIGS. 10 and 11, the radiator body is formed by oppositely fastening and then welding the first substrate and the second substrate. That is, the first groove on the first substrate and the second groove on the second substrate are provided in mirror symmetry. In this way, when the two substrates are fastened, the two grooves may form the above coolant liquid runner.

Similarly, the split-flow and diversion unit is formed by fastening the first split-flow and diversion column and the second split-flow and diversion column. That is, the first split-flow and diversion column is provided in the first groove, the second split-flow and diversion column is provided in the second groove, and both the two split-flow and diversion columns and the positions thereof are in mirror symmetry.

As will be readily appreciated, compared with the related art in which the radiator body is a one-piece solid body and a coolant liquid runner is formed by extrusion or the like, the coolant liquid runner in the embodiment of the present application may be formed by punching grooves on substrates and then fastening the grooves, thereby greatly reducing the weight of the radiator body to facilitate the usage.

Figure 12:
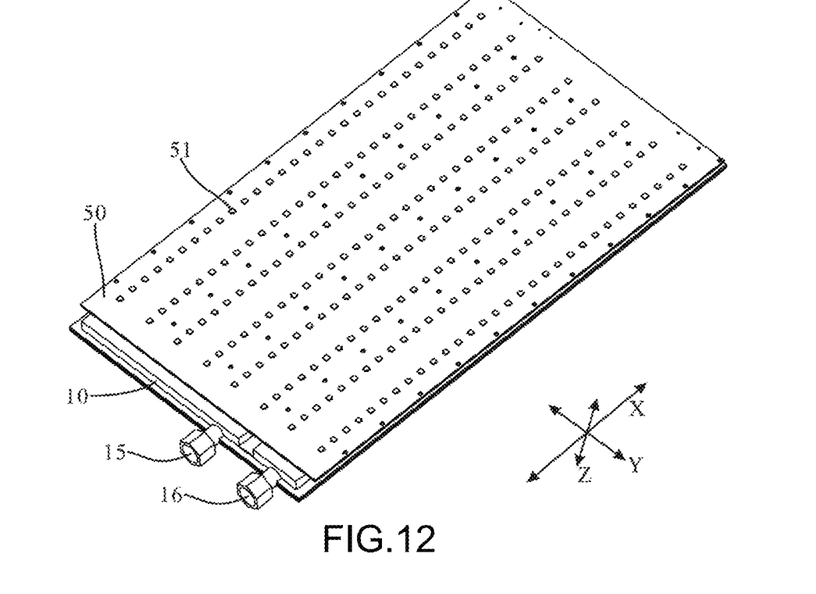
FIG. 12 is a structure diagram of a liquid-cooled plate radiator provided with a liquid-cooled electronic device according to an embodiment of the present application.
Figure 14:
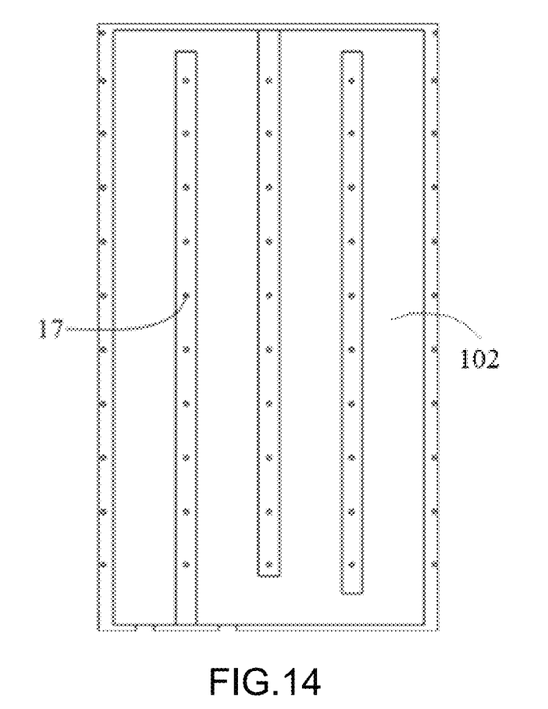
FIG. 14 is a structure diagram of a riveting stud according to an embodiment of the present application.

In addition, non-grooved surfaces of the first substrate and the second substrate are the above bearing surfaces for mounting a liquid-cooled electronic device such as a hash board. Specifically, with reference to FIGS. 12 and 14, a riveting stud 17 may be provided on the bearing surface, and then a fixing hole of the hash board is fixed on the riveting stud via a riveting screw.

In a specific implementation, two ends of the coolant liquid runner 20 respectively form a liquid inlet 13 and a liquid outlet 14 on an end face of the radiator body 10. The liquid inlet 13 is provided with a liquid inlet connector 15. The liquid outlet 14 is provided with a liquid outlet connector 16. The height of the first split-flow and diversion column 112 is lower than the depth of the first groove 111 along a depth direction of the first groove 111. The height of the second split-flow and diversion column 122 is lower than the depth of the second groove 121 along a depth direction of the second groove 121.

In the embodiment of the present application, on the one hand, with reference to FIGS. 10 and 11, two ends of the coolant liquid runner respectively form a liquid inlet and a liquid outlet. The liquid inlet and the liquid outlet are formed, for example, on a side wall between the two bearing surfaces of the radiator body. Then, the liquid inlet and the liquid outlet are respectively provided with a liquid inlet connector and a liquid outlet connector for connecting with an external pipeline.

Figure 13:
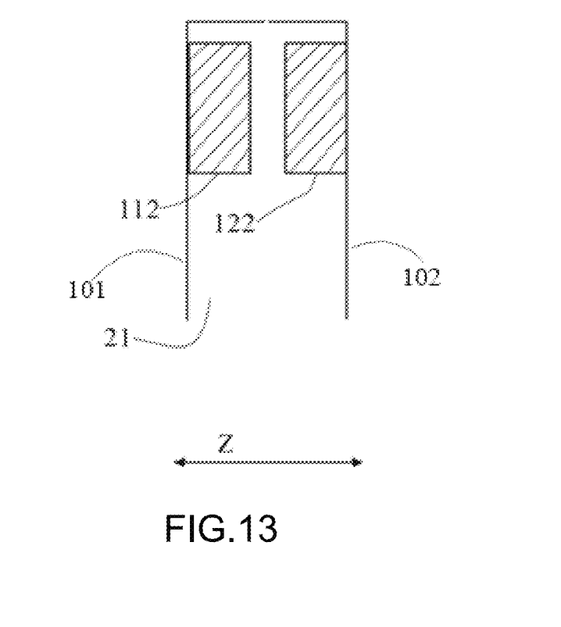
FIG. 13 is a structure diagram of a gap formed between a first split-flow and diversion column and a second split-flow and diversion column which are fastened according to an embodiment of the present application.

On the other hand, referring to FIG. 13, the heights of the first split-flow and diversion column and the second split-flow and diversion column are lower than the depths of the first groove and the second groove, respectively. In this way, when the two split-flow and diversion columns are fastened and butt-jointed, a gap is reserved between the two split-flow and diversion columns along the third direction, to allow the coolant liquid to flow therethrough, thereby preventing a great resistance to the flow of the coolant liquid.

Although the general principles of the present application have been described above in connection with specific embodiments, it is to be noted that the merits, advantages, effects, etc. mentioned in the present application are merely examples and are not to be considered as limiting, and these merits, advantages, effects, etc. must be possessed by the various embodiments of the present application. In addition, the specific details disclosed above are for purposes of example and explanation only and are not intended to be limiting, as the present application must be practiced with the above specific details.

The block diagrams of devices, apparatuses, equipment, and systems referred to in the present application are merely illustrative examples and are not intended to require or imply that the connections, arrangements and configurations must be made in the manner shown in the block diagrams. These devices, apparatuses, equipment, and systems may be connected, arranged and configured in any manner, as will be appreciated by those skilled in the art. The words such as "including", "comprising", "having", and the like are open-ended words that mean "including, but not limited to", and are used interchangeably. The words "or" and "and" as used herein refer to the word "and/or" and may be used interchangeably therewith unless the context clearly indicates otherwise. The word "such as" as used herein refers to the phrase "such as, but not limited to" and may be used interchangeably therewith.

It is also to be noted that in the apparatus, equipment and methods of the present application, the components or steps may be decomposed and/or recombined. Such decompositions and/or recombinations should be considered as equivalents to the present application.

The previous description of the disclosed aspects is provided to enable any person skilled in the art to make or use the present application. Various modifications to these aspects will be readily apparent to those skilled in the art, and the general principles defined herein may be applied to other aspects without departing from the scope of the present application. Therefore, the present application is not intended to be limited to the aspects shown herein but is to be accorded the broadest scope consistent with the principles and novel features disclosed herein.

The above description has been presented for purposes of illustration and description. In addition, this description is not intended to limit the embodiments of the present application to the form disclosed herein. Although various illustrative aspects and embodiments have been discussed above, those skilled in the art will recognize that certain variations, modifications, changes, additions, and sub-combinations thereof should be included within the protection scope of the present application.

What is claimed is:

1. A liquid-cooled plate radiator, comprising:
a radiator body;
a coolant liquid runner formed inside the radiator body, the coolant liquid runner being for circulating a coolant liquid, the coolant liquid runner comprising a plurality of radiating sub-runners; and
a plurality of fin units, the fin units being arranged on the radiating sub-runners along a flow direction of the coolant liquid, a fin unit of the fin units comprising a plurality of fins extending side by side along the flow direction of the coolant liquid,
wherein the fins of the adjacent fin units are staggered along the flow direction of the coolant liquid;
wherein the radiator body comprises a first substrate and a second substrate being opposite to each other, the first substrate is provided with a first groove, and the second substrate is provided with a second groove,
wherein the first groove and the second groove are in mirror symmetry, a first split-flow and diversion column is arranged in the first groove, a second split-flow and diversion column is arranged in the second groove, and the first split-flow and diversion column and the second split-flow and diversion column are in mirror symmetry;
wherein two ends of the coolant liquid runner respectively form a liquid inlet and a liquid outlet on an end face of the radiator body, the liquid inlet is provided with a liquid inlet connector, and the liquid outlet is provided with a liquid outlet connector;
a height of the first split-flow and diversion column is lower than a depth of the first groove along a depth direction of the first groove;
a height of the second split-flow and diversion column is lower than a depth of the second groove along a depth direction of the second groove.

2. The liquid-cooled plate radiator according to claim 1, wherein the radiator body has a first bearing surface and a second bearing surface opposite to each other, at least one of the first bearing surface and the second bearing surface is used for bearing a liquid-cooled electronic device, and the liquid-cooled electronic device comprises a plurality of heating elements arranged in an array, wherein
a predetermined gap is formed between the adjacent fin units along the flow direction of the coolant liquid, and the predetermined gap corresponds to a surface of the radiator body and avoids the heating elements;
the adjacent fins in each of the fin units are arranged side by side at a predetermined interval, and the adjacent fin units are staggered at half of the predetermined interval.

3. The liquid-cooled plate radiator according to claim 1, further comprising:
split-flow and diversion units, being arranged in the coolant liquid runner,
wherein a split-flow and diversion unit of the split-flow and diversion units is arranged at an end of a radiating sub-runner of the radiating sub-runners corresponding to an inflow of the coolant liquid, and the split-flow and diversion unit is configured to divert the coolant liquid into the radiating sub-runner.

4. The liquid-cooled plate radiator according to claim 3, wherein a split-flow tip is formed at an end of the split-flow and diversion unit facing the coolant liquid relative to the flow direction of the coolant liquid, and the split-flow and diversion unit is bifurcated and extended from the split-flow tip along the flow direction of the coolant liquid with a first split-flow and diversion surface and a second split-flow and diversion surface.

5. The liquid-cooled plate radiator according to claim 4, wherein a diversion tip is formed at an end of the split-flow and diversion unit facing away from the coolant liquid, relative to the flow direction of the coolant liquid, and the diversion tip is formed by converging a third split-flow and diversion surface and the first split-flow and diversion surface, wherein the third split-flow and diversion surface extends along an axial direction of the radiating sub-runner from an end of the second split-flow and diversion surface.

6. The liquid-cooled plate radiator according to claim 5, wherein along a radial direction of the coolant liquid runner, the coolant liquid runner is divided into two branches with a first width and a second width at the split-flow tip, and the coolant liquid runner is divided into two branches with a third width and a fourth width at the diversion tip, wherein a ratio of the first width to the second width is equal to a ratio of the third width to the fourth width.

7. The liquid-cooled plate radiator according to claim 5 wherein the split-flow tip protrudes out of a region enclosed by an extension line of a side wall of the radiating sub-runner at a corner of an end of the radiating sub-runner.

8. The liquid-cooled plate radiator according to claim 5, wherein the radiating sub-runner extends along a first direction, the plurality of radiating sub-runners are arranged side by side and connected in series to form the coolant liquid runner, ends of the adjacent radiating sub-runners are connected through a connecting sub-runner along a second direction, and the second direction is perpendicular to the first direction;
the split-flow and diversion unit comprises a split-flow and diversion column with a right triangle cross section, wherein the first split-flow and diversion surface corresponds to a hypotenuse of the right triangle, and the second split-flow and diversion surface and the third split-flow and diversion surface respectively correspond to two right angle sides of the right triangle.

* * * * *